(12) United States Patent
Grbovic

(10) Patent No.: US 7,368,972 B2
(45) Date of Patent: May 6, 2008

(54) POWER TRANSISTOR CONTROL DEVICE

(75) Inventor: Petar Grbovic, Pacy s/Eure (FR)

(73) Assignee: Schneider Toshiba Inverter Europe Sas, Pacy Sur Eure (FR)

( * ) Notice: Subject to any disclaimer, the term of this patent is extended or adjusted under 35 U.S.C. 154(b) by 65 days.

(21) Appl. No.: 11/188,843

(22) Filed: Jul. 26, 2005

(65) Prior Publication Data

US 2006/0044025 A1 Mar. 2, 2006

(30) Foreign Application Priority Data

Aug. 27, 2004 (FR) .................................. 04 09129

(51) Int. Cl.
*H03K 17/687* (2006.01)
*H03B 1/00* (2006.01)
(52) U.S. Cl. ...................... 327/434; 327/108
(58) Field of Classification Search ................ 327/108, 327/427, 434, 440, 478; 363/19, 21.01, 23, 363/25
See application file for complete search history.

(56) References Cited

U.S. PATENT DOCUMENTS

| 6,285,235 B1 * | 9/2001 | Ichikawa et al. ............ 327/374 |
| 6,556,062 B1 * | 4/2003 | Wallace ........................ 327/434 |
| 7,038,500 B2 * | 5/2006 | do Nascimento ............ 327/108 |
| 2002/0131276 A1 * | 9/2002 | Katoh et al. ................... 363/16 |

FOREIGN PATENT DOCUMENTS

EP 0 913 919 A2 5/1999

OTHER PUBLICATIONS

H.G. Eckel, L. Sock, "Optimization of the Turn-Off Performance of IGBT at Overcurrent and Short-Circuit Current," Institute for Electrical Drives, University of Erlangen, Germany, 1993, pp. 317-322.*
Eckel et al. "Optimization of the Turn-Off Performance of IGBT at Overcurrent and Short-Circuit Current." 1993. Institute for Electrical Drives, University of Erlangen, Germany. p. 319-320.*
H.-G. Eckel, et al. "Optimization of the Turn-Off Performance of IGBT At Overcurrent and Short-Circuit Current", The European Power Electronics Association, 1993, pp. 317-322, XP006511564.

* cited by examiner

*Primary Examiner*—Quan Tra
*Assistant Examiner*—Colleen O'Toole
(74) *Attorney, Agent, or Firm*—Oblon, Spivak, McClelland, Maier & Neustadt, P.C.

(57) ABSTRACT

The invention relates to a gate control device 10 of a power semiconductor component 11 of the IGBT type. A ramp generator circuit 20 delivers a reference gate voltage at its output. A stage for the current amplification of the said reference voltage delivers a gate current to the IGBT component, this amplification stage comprising an ignition circuit 30 and a rapid extinction circuit 40. A slow extinction circuit 50 is connected between the gate G of the IGBT component and the output of the generator circuit. A circuit 60 for the detection of a collector-emitter voltage of the component is connected to a feedback circuit 70 delivering a feedback signal 71 that acts on the rapid extinction circuit 40 and on the output 22 of the generator circuit.

10 Claims, 3 Drawing Sheets

POWER TRANSISTOR CONTROL DEVICE

Figure 1:
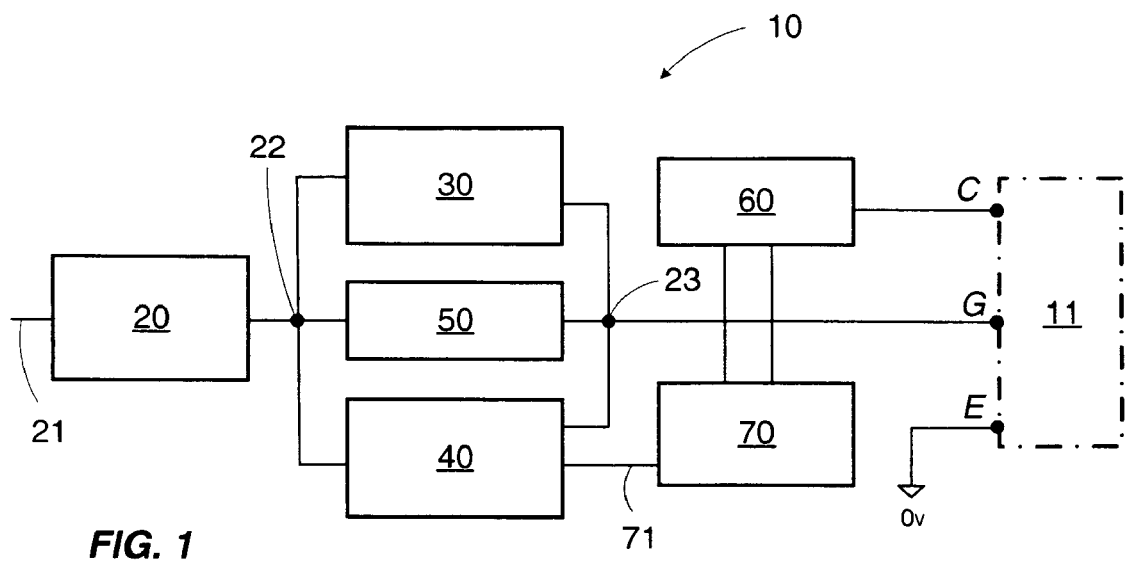

The present invention relates to a control device for power electronic semiconductor components, of the IGBT (Insulated Gate Bipolar Transistor) or MOSFET (Metal Oxide Silicon Field Effect Transistor) type, aimed notably at improving the extinction process of the components, in particular as regards their use in Pulse Width Modulation (PWM) inverters.

PWM inverters are often found in applications such as UPS (Uninterruptable Power Supply) systems or speed converters, of the frequency-converter type, for asynchronous electric motors. In a three-phase frequency converter, a rectifier delivers a continuous bus voltage source, for example of 250-400 V or 500-800 V, derived from a three-phase power network. From this continuous bus, an inverter then produces a voltage with variable amplitude and frequency that allows the motor to be controlled. In a known manner, such an inverter can comprise six high-power IGBT components each one being in parallel with an FWD (Free Wheeling Diode). As an example, for a continuous bus source with a respective value of 250-400 V or 500-800 V, IGBTs with a collector voltage of respectively 600 V or 1200 V can be used.

An IGBT is a well-known power component behaving, in a simplified scenario, as a field effect (MOSFET) transistor cascaded with a bipolar-junction transistor (BJT). At its input, an IGBT is voltage-controlled via a gate electrode like a MOSFET, but the current output characteristics are close to those of a BJT transistor. The short-circuit behaviour represents one of the appreciable advantages of the IGBT. The value of the gate-emitter voltage, sometimes called gate voltage, is generally around 15 to 17 V in the ON state in order to reduce the conduction losses. The value of the gate voltage in the OFF state depends on different factors: continuous bus voltage, gate-emitter capacitance, desired slope of the collector voltage. It is generally of the order of 0 to −15 V in order to avoid a spurious ignition of the opposing device when the transistor switches.

During the extinction of an IGBT (in other words going from the conducting ON state to the non-conducting OFF state), high over-voltages may be generated between collector and emitter by the abrupt variations in the current through the parasitic inductances in the IGBT. These over-voltages are directly proportional to the rate of change of the collector current of the IGBT (switching speed). With high currents, the switching speed is increased thus causing considerably high over-voltages upon extinction. This is particularly the case during a short-circuit when the switching current can reach 6 to 8 times the nominal current, the over-voltages thus induced then being capable of causing the destruction of the IGBT.

During its extinction phase, an IGBT does not operate in its linear operation region and the slope of the collector current cannot be controlled. The slope of the collector current could be independently controlled if a high gate resistance were employed. However, in this case the extinction power losses and the total duration of the extinction would increase. The increase in the extinction duration would then demand that the programmed dead time be lengthened, which could notably cause an problem of oscillation of the motor current and of the torque, particularly at reduced speed.

With conventional control commands, the extinction speed cannot be controlled effectively without suffering high extinction losses, in particular for 600 V IGBT modules that have maximum operating voltages greater than 400 V. In order to prevent the destruction of IGBTs during an over-voltage, standard gate control circuits activate a slow extinction (called desaturation protection) when a short-circuit is detected. However, the problem is that the extinction of a fast IGBT can start before the slow extinction is activated by the desaturation protection. In this case, the IGBT gate capacitance is rapidly discharged, which causes a rapid change in the collector current and, consequently, high extinction over-voltages.

In this case, a known solution is to use peak-limiting capacitors, or peak limiters. Nevertheless, this solution is expensive and bulky, is only partly effective in limiting the over-voltages and can create undesirable resonances.

Other solutions have also been proposed. In these various solutions, information on the state of the IGBT needs to be detected and, in response to this information, a feedback action needs to be imposed on the IGBT gate control circuit. For example, the document U.S. Pat. No. 5,926,012 proposes an active gate control circuit based on the leakage inductance between the power emitter and the auxiliary emitter of the IGBT and on the detection of di/dt. The document U.S. Pat. No. 6,208,185 proposes an active gate control circuit based on a three-stage circuit for controlling di/dt and dv/dt. The document U.S. Pat. No. 6,459,324 proposes an active gate control circuit based on a feedback of the gate-emitter voltage in order to control the gate resistance during the IGBT extinction and ignition processes.

The main problem of the methods based on a feedback of information on the state of the IGBT is that, with the new generations of components, particularly low-voltage, fast-switching IGBTs, the time available for the protection circuit to react is very short and these methods can turn out to be too slow particularly for an arm short circuit or other short-circuit conditions when the IGBT is operating in its active region. It is then not certain of definitely reaching a short-circuit current with a maximum operating bus voltage.

With this in mind, the present invention describes a gate control device that comprises feedback, together with a feed-forward of the gate voltage of the power component, such as an IGBT, so as to control the collector-emitter overvoltage $V_{CE}$ effectively during the extinction phase. The invention allows the slope of the extinction current to be controlled simply and effectively under all the conditions of operation.

The over-voltage created, during the extinction of the IGBT, by the parasitic inductance of the continuous bus and the internal inductance of the IGBT is controlled. This allows the need for costly and bulky HF peak-limiting capacitors to be eliminated and a continuous bus structure with low inductance is not absolutely necessary. The gate control proposed can control the over-voltage effectively under all normal conditions of use, including during overload and short-circuit conditions with a maximum bus voltage applied, typically during dynamic braking.

The losses associated with the switching and the total switching duration under nominal conditions are not increased. The switching losses with the gate control proposed in the invention can be lower than the switching losses with a conventional gate control, depending on the IGBT technology (NPT, SPT, TRENCH).

For this purpose, the invention describes a gate control device of a power semiconductor component of the IGBT type, comprising an input circuit delivering at its output a reference gate voltage from a control command for the IGBT component, a stage for the current amplification of the said reference voltage in order to deliver a gate current to the IGBT component, this amplification stage comprising an ignition circuit and a rapid extinction circuit, a slow extinction circuit connected between the gate of the IGBT component and the output of the input circuit, a circuit for the detection of a collector-emitter voltage of the IGBT component. The input circuit is a ramp generator circuit and the device comprises a feedback circuit connected to the output of the detection circuit and delivering a feedback signal that acts on the rapid extinction circuit and on the output of the generator circuit.

According to one feature, the ramp generator circuit delivers a reference voltage with a rising ramp following an ignition control command for the IGBT component and with a falling ramp, different from the rising ramp, following an extinction control command for the IGBT component.

According to another feature, during an extinction phase of the IGBT component, the detection circuit detects a threshold overshoot of the collector-emitter voltage of the IGBT component and a threshold overshoot of the variation in the collector-emitter voltage of the IGBT component.

According to another feature, the rapid extinction circuit comprises a main bipolar transistor whose base is driven by the output of the generator circuit and by the feedback signal, and whose emitter is connected to the gate of the IGBT component via an extinction resistor. The slow extinction circuit comprises a discharge resistor whose resistance is greater than the extinction resistor.

According to another feature, the feedback circuit comprises an auxiliary bipolar transistor whose base is connected to a first output of the detection circuit, whose collector is connected to a positive power supply voltage and whose emitter is connected to the feedback signal, so as to hold the feedback signal for a defined hold time. A second output of the detection circuit is directly connected to the feedback signal.

The invention also describes a control apparatus for an electric motor comprising two power components of the IGBT type for each phase of the said motor, each power component of the apparatus being controlled by such a control device.

Lastly, the invention describes a control method for controlling the extinction of a power semiconductor component of the IGBT type, the method comprising three steps. During a first step, the gate-emitter capacitance of the IGBT component discharges mainly through an extinction resistor of a rapid extinction circuit. During a second step, a feedback circuit connected to the output of a circuit for the detection of a collector-emitter voltage of the IGBT component delivers a feedback signal acting on the rapid extinction circuit, such that the gate-emitter capacitance discharges for a hold time only through a discharge resistor whose resistance is greater than the extinction resistor. During a third step, the gate-emitter capacitance discharges mainly through the extinction resistor.

Figure 2:
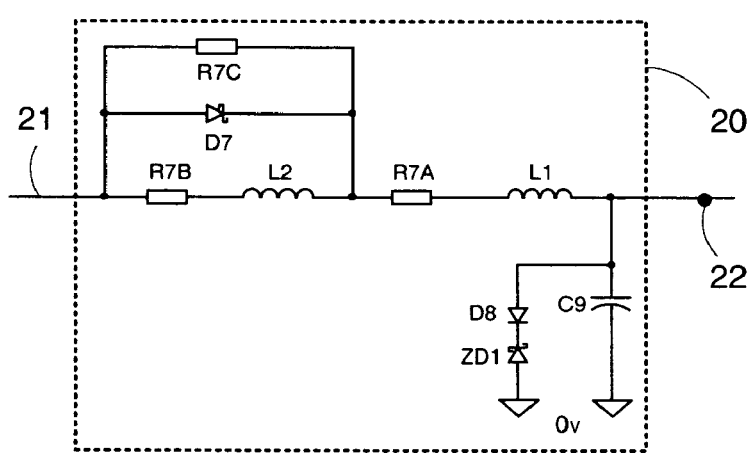
Figure 3:
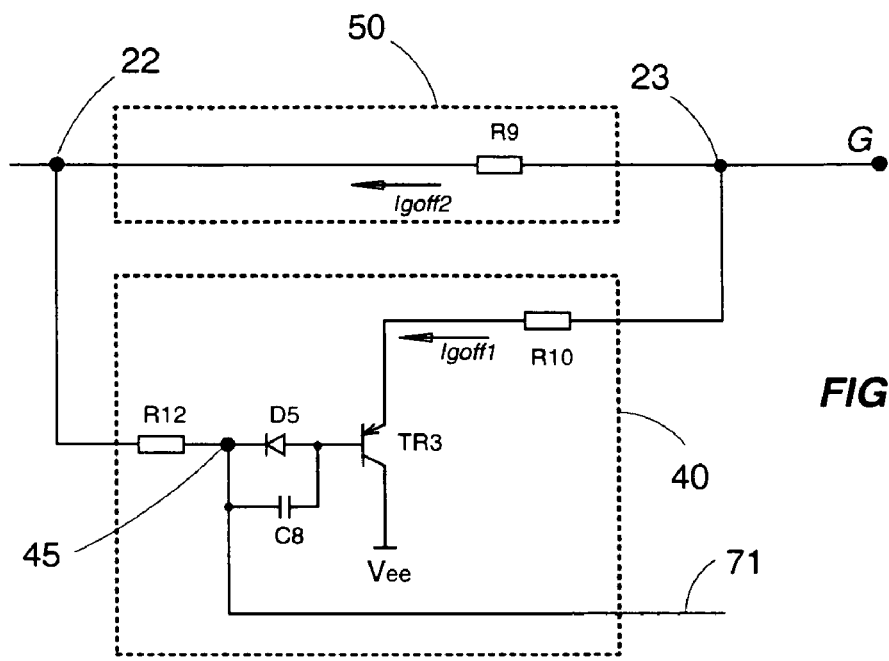
Figure 4:
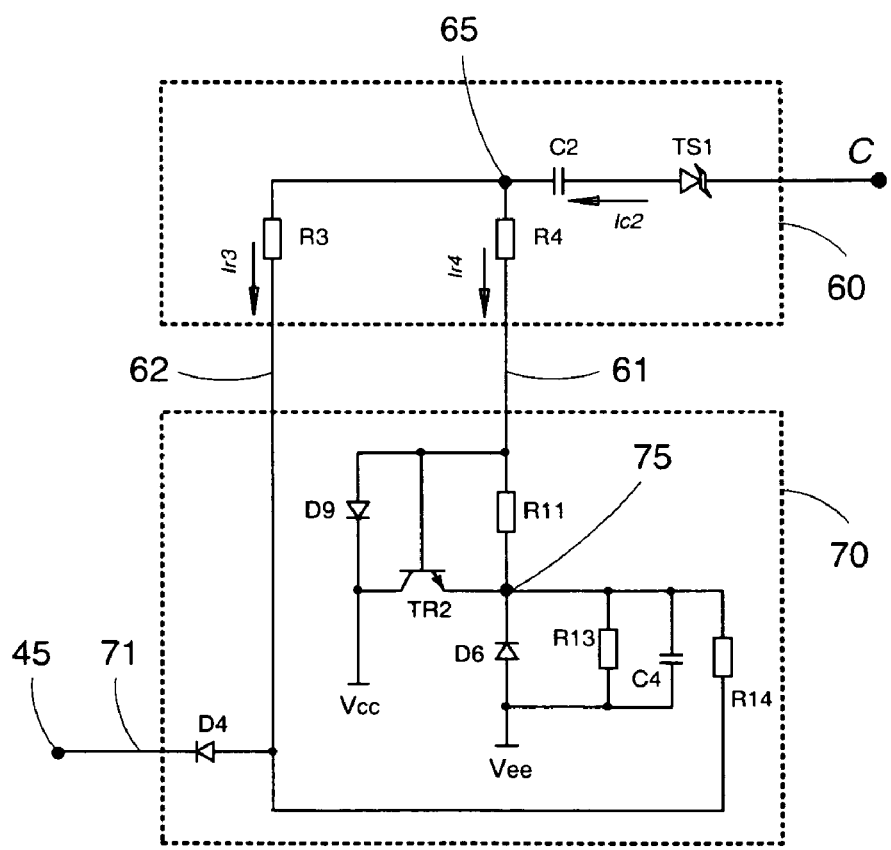
Figure 5:
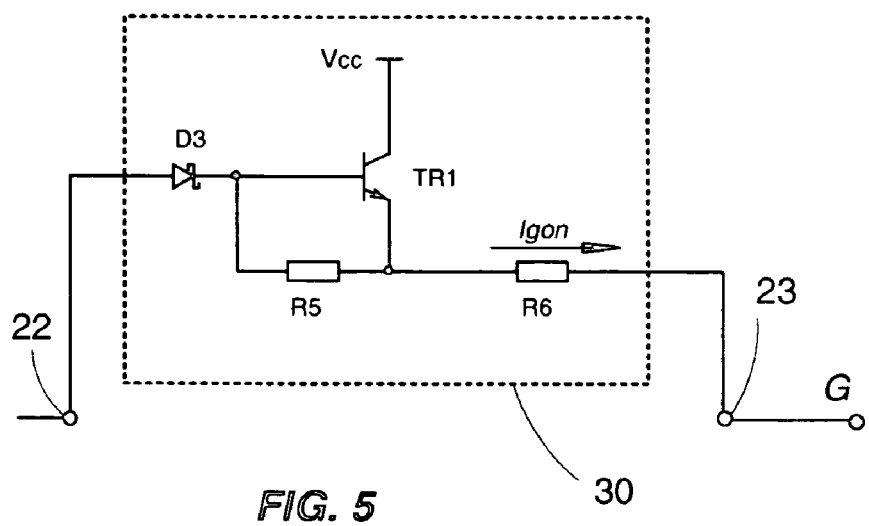
Figure 6:
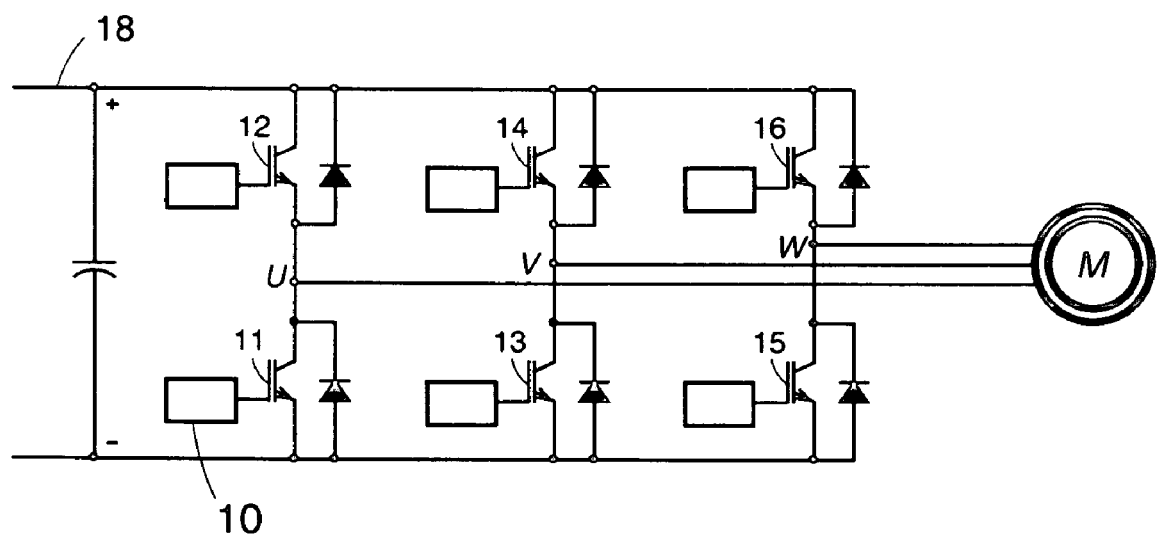

Other features and advantages will become apparent in the detailed description that follows which makes reference to an exemplary embodiment represented by the appended drawings in which:

FIG. 1 shows the general principle, in simplified form, of an embodiment of the control device according to the invention, FIG. 2 details an exemplary circuit diagram of the ramp generator circuit, FIG. 3 details an exemplary circuit diagram of the rapid extinction circuit and of the slow extinction circuit, FIG. 4 details an exemplary circuit diagram of the detection circuit and of the feedback circuit, FIG. 5 details an exemplary circuit diagram of the ignition circuit, FIG. 6 shows the application of the control device described in the invention for the control of a three-phase motor.

With reference to FIG. 1, a power semiconductor component 11, of the IGBT transistor type, comprises a gate G (or GATE), a collector C (or COLLECTOR) and an emitter E (or EMITTER). A gate control device 10 for the IGBT 11 is designed to deliver a control current onto the gate G starting from a signal, or control command, arriving at an input 21 and originating, for example, from an upstream processing unit. In the present embodiment, the input voltage 21 takes approximately a value of +16 V, called positive power supply voltage $V_{cc}$, for controlling the ON state of the IGBT 11 and a value of −10 V, called negative power supply voltage $V_{EE}$, for controlling the OFF state of the IGBT 11.

The control device 10 comprises a ramp generator circuit 20, a current amplification stage composed of an ignition circuit 30 and of a rapid extinction circuit 40, a slow extinction circuit 50, a circuit 60 for the detection of a collector-emitter voltage $V_{CE}$ and a feedback circuit 70 acting on the rapid extinction circuit 40.

With reference to the circuit diagram in FIG. 2, the ramp generator circuit 20 receives a control command at the input 21 and delivers a reference gate voltage at its output on a node 22. This ramp generator circuit 20 comprises resistors R7A, R7B and R7C, a capacitor C9 together with inductors L1, L2 that allow a rising ramp to be created for the reference voltage following an ignition command for the component 11 (going from the OFF state to the ON state, in other words a rising edge of the input 21), as well as a falling ramp for the reference voltage following an extinction command for the component 11 (going from the ON state to the OFF state, in other words a falling edge of the input 21). These ramps allow the variations in the reference voltage, and hence the variations in the collector current of the IGBT, to be controlled.

Preferably, the rising ramp of the reference voltage during the ignition of the component 11 is different from the falling ramp during the extinction of the component 11, thus giving more flexibility in the setting up of the control device. For this purpose, the generator circuit 20 comprises for example a diode D7 in parallel with R7B, R7C and L2. Upon the rising edge of the input 21, the diode D7 is conducting and the ignition ramp is only defined by the resistor R7A, the inductor L1 and the capacitor C9. On the other hand, upon a falling edge of the input 21, the diode D7 is no longer conducting and the extinction ramp is defined by the resistors R7A, R7B and R7C, the inductors L1 and L2 and the capacitor C9. This arrangement allows the reference voltage to be given a lower slope for the extinction of the IGBT than for the ignition. The adjustments of the elements R7A, R7B, R7C, C9, L1 and L2 depend on the desired performance and on the characteristics of the IGBT to be controlled. A damping circuit, composed of a diode D8 and a Zener diode ZD1 in parallel with the capacitor C9, allows the voltage overshoot to be limited to a value for example close to +16.5 V.

The current amplification stage of the control device 10 delivers a gate current to the IGBT component starting from the reference voltage of the node 22. It comprises an ignition circuit 30 and a rapid extinction circuit 40 that are both connected between the node 22 and a node 23, which is directly connected to the gate G of the IGBT 11. According to a preferred embodiment, this amplification stage is of the PUSH-PULL type.

FIG. 5 details the ignition circuit 30 of the amplification stage. The ignition circuit 30 is connected between the node 22 and the node 23. It comprises a bipolar transistor TR1, of the npn type, whose collector is connected to the positive power supply voltage $V_{cc}$ (substantially equal to +16 V), whose emitter is connected to an ignition resistor R6 and whose base is connected to the cathode of a diode D3. The other end of the ignition resistor R6 is connected to the node 23. The anode of the diode D3 is connected to the node 22. The gate-emitter capacitance of the IGBT 11 is charged up through the diode D3, the transistor TR1 and the resistor R6. The diode D3 is used to avoid the breakdown of TR1 during the extinction phase, when the base-emitter voltage of TR1 can be greater than 10 V and can cause increased power losses in TR1. The ignition resistor R6 limits the charge current $I_{gon}$ of the gate G and also avoids the parasitic oscillation of the gate-emitter voltage caused by the gate-emitter capacitance and the leakage inductance between the gate connection terminal on the IGBT and the control device. The minimum value of the ignition resistor R6 depends on the gate inductance and on the IGBT gate-emitter capacitance in the OFF state.

During the ignition of the IGBT, the collector-emitter voltage $V_{CE}$ begins to fall, such that the gate-emitter voltage remains within the region known as the Miller plateau. The voltage output from the ramp generator 20 continues to increase according to the ignition ramp and the gate charge current begins to increase. A high gate charge current accelerates the charging of the Miller capacitance and reduces the residual voltage and also the power losses on ignition. This effect depends on the gate resistance and on the ramp of the reference gate voltage.

FIG. 3 details the rapid extinction circuit 40 of the amplification stage. The circuit 40 is connected between the node 22 and the node 23. It comprises a main bipolar transistor TR3, of the pnp type, whose emitter is connected to the node 23 via an extinction resistor R10 and whose collector is connected to the negative power supply voltage $V_{EE}$ (substantially equal to −10 V). The base of TR3 is connected to a node 45 through a diode D5 in parallel with a capacitor C8. The capacitor C8 allows a faster turn-off of the transistor TR3. The node 45 is connected to the node 22 via a resistor R12 and is connected to a feedback signal 71 coming from the feedback circuit 70.

According to the invention, the control circuit also comprises a slow extinction circuit 50 that is directly connected between the node 22 and the node 23 and that comprises a discharge resistor R9. The value of the discharge resistor R9 is much higher than the ignition resistor R6, such that the ignition of the component 11 happens with a higher priority through the ignition circuit 30. In addition, the value of R9 is much greater than the value of the extinction resistor R10, such that, when the main transistor TR3 is conducting, the extinction of the component 11 happens with a higher priority through the rapid extinction circuit 40.

FIG. 4 details the detection circuit 60 and the feedback circuit 70.

The function of the detection circuit 60 is to quickly detect an increase in the collector-emitter voltage $V_{CE}$ of the IGBT 11. It comprises a peak-limiting Zener diode TS1 of the Transient Voltage Suppressor type, that is faster than a normal Zener diode, whose cathode is connected to the collector C of the IGBT 11 and whose anode is connected to a capacitor C2, the other end of the capacitor C2 being connected to a node 65. When the voltage $V_{CE}$ begins to increase, the capacitor C2 begins to charge up through the junction capacitance of the diode TS1. This junction capacitance of the diode TS1 depends on the voltage $V_{CE}$ and on the variation of the voltage $V_{CE}$ with time. These functions are not linear, particularly at the beginning of the extinction phase. Assuming that the reverse conduction voltage of the diode TS1 is much higher than the positive power supply voltage $V_{CC}$, then the junction capacitance of TS1 is much lower than the capacitance of the capacitor C2 for a TS1 voltage close to the reverse conduction voltage. When the voltage $V_{CE}$ is higher than the reverse conduction voltage of TS1, the diode TS1 is conducting and the capacitor C2 charges up with a current $I_{c2}$. The current $I_{c2}$ of the capacitor C2 is divided between currents $I_{r3}$ and $I_{r4}$, which depend on the resistors R3 and R4 connected to the node 65, to give two outputs, 62, 61 respectively, of the detection circuit 60.

The detection circuit 60 thus allows a threshold overshoot of the value of the voltage $V_{CE}$ (for example around 25% to 60% of the DC bus voltage) and a threshold overshoot of the variation in the voltage $V_{CE}$ (for example of the order of a few kVolts per microsecond) to be detected, so as to rapidly generate the currents $I_{r3}$ and $I_{r4}$ that are substantially proportional to the variation in the voltage $V_{CE}$. This then allows the overvoltage in the collector-emitter voltage $V_{CE}$ during the extinction phase to be controlled effectively. The values of these overshoot thresholds depend on the technology used for the IGBT component.

The feedback circuit 70, shown in FIG. 4, receives the first output 61 (current $I_{r4}$) and the second output 62 (current $I_{r3}$) of the detection circuit 60 and is charged to deliver, at its output, a feedback signal 71 that is connected to the node 45 of the rapid extinction circuit 40.

The second output 62 of the detection circuit 60, carrying the current $I_{r3}$ from R3, is directly connected to the feedback signal 71 through a diode D4. The feedback circuit 70 comprises an auxiliary bipolar transistor TR2 of the npn type. The collector of the auxiliary transistor TR2 is connected to the positive power supply voltage $V_{CC}$, the base of TR2 is connected to the first output 61 carrying the current $I_{r4}$ from R4, and the emitter of TR2 is connected to a node 75. A diode D9 links the base and the collector of TR2. The node 75 is connected to the feedback signal 71 through the diode D4 and a resistor R14. Furthermore, a diode D6, a resistor R13 and a capacitor C4 are connected in parallel between the node 75 and the negative power supply voltage $V_{EE}$ so as to allow the capacitor C2 to discharge during the ignition of the IGBT component 11.

Thus, the extinction phase of the IGBT component 11 comprises three steps:

1) During a first step, the main transistor TR3 is conducting and the auxiliary transistor TR2 is off. The gate-emitter capacitance of the IGBT 11 discharges mainly through the extinction resistor R10 (because R10 is much lower than R9) and the main resistor TR3, with a strong discharge current $I_{goff1}$ and a reduced Miller plateau time. At the end of the first step, the gate-emitter voltage is below the Miller plateau, and the internal MOSFET transistor of the IGBT component 11 becomes close to the OFF state. In this case, most of the collector current is the current of the internal transistor BJT of the component 11. The final value of the gate-emitter voltage depends on the technology of the IGBT component and may be approximately zero. This first step will bring about an increase in the voltage $V_{CE}$ that will be detected by the detection circuit 60.

2) A second step starts when the detection circuit 60 detects a threshold overshoot of the voltage $V_{CE}$ of the component 11 (thanks to the diode TS1) and a threshold overshoot of the variation in the voltage $V_{CE}$ of the component 11 (thanks to the capacitor C2) bringing about the currents $I_{r3}$ and $I_{r4}$. Thus, when these thresholds are overshot, the feedback circuit 70 rapidly turns the main transistor TR3 off through the feedback signal 71, via the current $I_{r3}$. Consequently, the gate-emitter capacitance of the IGBT 11 discharges from now on only through the discharge resistor R9, with a low discharge current $I_{goff2}$ lower than $I_{goff1}$. Moreover, most of the current $I_{r4}$ will flow through the base of the transistor TR2, which will then be turned on.

At this stage, the gate-emitter voltage is below the Miller plateau. However, since the internal MOSFET transistor is in the OFF state and the voltage $V_{CE}$ rapidly rises, the gate-emitter capacitance charges up with an additional current (higher than the discharge current) from the Miller capacitance of the IGBT 11. Thus, the gate-emitter voltage returns to a higher level than the Miller plateau, hence the MOSFET transistor turns back ON so that the collector current can once more be controlled. The gate-emitter capacitance is recharged by the Miller capacitance.

As long as the auxiliary transistor TR2 is off during the first step, the voltage at the node 75 is approximately equivalent to the power supply voltage $V_{EE}$ and the diode D9 is non-conducting. During the second step, the transistor TR2 starts to conduct, which leads to an increase in the voltage at the node 75 towards a value close to the positive power supply voltage $V_{CC}$. The diode D9 starts to conduct which heavily saturates the transistor TR2 and, at the end of the period required to charge up the capacitor C4, a current flows in the feedback signal 71 via the resistor R14 and the diode D4. Thanks to this assembly, the transistor TR2 will be able to be kept conducting for a defined hold time (or storage time) after the first output 61 is cancelled.

Simultaneously, the current $I_{r3}$ flows through the diode D4 and the voltage at the node 45 immediately begins to rise. At the node 45, the current coming from the feedback signal 71 divides itself between a feedback current flowing through the resistor R12 to act on the reference voltage at the node 22 and a current charging the capacitor C8, which allows the main transistor TR3 to be turned off. The voltage at the node 45 is approximately equivalent to the positive power supply voltage $V_{CC}$ and maintains the diode D5 and the transistor TR3 in the non-conducting state.

The internal MOSFET transistor of the IGBT is then close to the OFF state. The value and the slope of the voltage $V_{CE}$ of the IGBT are then defined by the dynamic characteristics of the internal BJT transistor of the IGBT. A rapid increase in the voltage $V_{CE}$ generates a feedback signal 71 which turns off the main transistor TR3 and re-injects current into the gate capacitance via the Miller capacitance, such that the gate-emitter voltage begins to rise as far as the Miller plateau and resets the internal MOSFET transistor into the ON state. The IGBT returns to its range of linear operation so that the ramp of the gate-emitter voltage is once more able to control the slope of the collector current.

Advantageously, when the main transistor TR3 is OFF, the gate-emitter capacitance continues to discharge with a low current $I_{goff2}$, thanks to the discharge resistor R9 of the slow extinction circuit 50, and following the extinction ramp of the reference voltage output from the circuit 20.

During the second step, the voltage $V_{CE}$ of the IGBT ceases to rise and variation in voltage $V_{CE}$ passes back below its overshoot threshold, which cancels the outputs 61, 62. However, this second step is extended as the auxiliary transistor TR2 remains conducting over the hold time due to the saturation (i.e. the period of time that elapses between the zero crossing of the base of TR2 and the start of the increase in the current in the collector of the TR2), that is to say a time of around 0.5 to 1 microsecond approximately.

During this defined holding time, the main transistor TR3 is advantageously held in the off state by the feedback signal 71. This hold time is long as the main transistor TR3 must remain off long enough for the IGBT to be completely extinguished, under all conditions. At the end of this hold time, the auxiliary transistor TR2 switches back to the off state and the voltage at the node 75 progressively decreases down to the negative supply voltage $V_{EE}$. The diode D4 is off and the main transistor TR3 becomes conducting again, thereby initiating the third step.

3) A third and final step allows the discharging of the gate-emitter capacitance of the IGBT 11 to be rapidly concluded, which has the result of shortening the total duration of the extinction phase of the IGBT. During this step, the gate-emitter capacitance discharges with a high current through the extinction resistor R10, since the main transistor TR3 is once more conducting. This then allows the extinction phase to be rapidly concluded.

The collector current thus decreases with the slope defined by the reference voltage ramp and the dynamic transconductance $g_m$. The voltage $V_{CE}$ remains at a peak value defined by the slope of the collector current and the total switching inductance. When the collector current reaches the residual current (or tail current), the voltage $V_{CE}$ falls approximately to the continuous bus voltage.

The capacitor C2 will be discharged by the resistors R11, R4 and the diode D6 of the circuit 70 during the next ignition phase of the component IGBT, when the voltage $V_{CE}$ will begin to fall.

FIG. 6 shows an exemplary application of the invention in an apparatus for controlling an asynchronous three-phase electric motor M of the frequency converter type. The control apparatus comprises two components for the control of each phase U,V,WW of the motor M, namely six power components 11,12,13,14,15,16 in the example of a three-phase motor. The components 11,12,13,14,15,16 are designed to supply a voltage with variable amplitude and variable frequency to the motor derived from a voltage from a continuous bus 18, thus allowing the motor to deliver a variable speed. Each IGBT power component is controlled using a control device 10 according to the present invention.

It will, of course, be understood that other variants and improvements of detail, and even the use of equivalent means, may be envisaged without straying from the scope of the invention.

The invention claimed is:

1. Gate control device of a power IGBT semiconductor component, comprising:
    an input circuit configured to deliver at its output a reference gate voltage in response to a control command of the IGBT component, the input circuit being a ramp generator circuit;
    a stage configured to amplify a current of the reference gate voltage which is configured to deliver a gate current to the IGBT component, the amplification stage comprising,
    an ignition circuit, and
    a rapid extinction circuit including a bipolar transistor;
    a slow extinction circuit connected between a gate of the IGBT component and the output of the input circuit;
    a circuit configured to detect a collector-emitter voltage of the IGBT component; and
    a feedback circuit connected to a output of the detection circuit, and configured to deliver a feedback signal that acts on the rapid extinction circuit and on the reference gate voltage
    wherein the bipolar transistor has a base driven by the output of the ramp generator circuit and by the feedback signal.

2. A control device according to claim 1, wherein the ramp generator circuit establishes a reference voltage according to a rising ramp following an ignition control command for the IGBT component and according to a falling ramp, different from the rising ramp, following an extinction control command for the IGBT component.

3. A control device according to claim 1, wherein the detection circuit detects a threshold overshoot of the collector-emitter voltage of the IGBT component and a threshold overshoot of the variation in the collector-emitter voltage of the IGBT component.

4. A control device according to claim 1, wherein a emitter of the bipolar transistor is connected to the gate of the IGBT component via an extinction resistor.

5. A control device according to claim 4, wherein the slow extinction circuit comprises a discharge resistor whose resistance is greater than the extinction resistor.

6. A control device according to claim 1, wherein the amplification stage is a PUSH-PULL amplifier.

7. A control device according to claim 1, wherein the feedback circuit comprises an auxiliary bipolar transistor whose base is connected to a first output of the detection circuit, whose collector is connected to a positive power supply voltage and whose emitter is connected to the feedback signal, so as to hold the feedback signal for a defined hold time.

8. A control device according to claim 7, wherein a second output of the detection circuit is directly connected to the feedback signal.

9. A control apparatus for a motor comprising two power IGBT components for each phase of said motor, wherein each power IGBT component of the control apparatus is controlled by a control device according to one of the preceding claims.

10. Control method for controlling the extinction of a power IGBT semiconductor component, the method comprising:

providing a reference gate voltage for the IGBT component, the reference gate voltage being a ramp voltage;

discharging a gate-emitter capacitance of the IGBT component mainly through an extinction resistor of a rapid extinction circuit including a main bipolar transistor having an emitter connected to the gate of the IGBT component via the extinction resistor;

delivering, from a feedback circuit connected to a output of a circuit configured to detect a collector-emitter voltage of the IGBT component, a feedback signal configured to act on the main bipolar transistor and on the reference gate voltage, so that the gate-emitter capacitance discharges for a hold time only through a discharge resistor whose resistance is greater than the extinction resistor; and discharging the gate-emitter capacitance mainly through the extinction resistor.

* * * * *